United States Patent [19]
Candy

[11] Patent Number: 6,052,027
[45] Date of Patent: Apr. 18, 2000

[54] WIDEBAND OPERATIONAL AMPLIFIER HAVING A PLURALITY OF FEEDBACK LOOPS

[75] Inventor: Bruce Halcro Candy, Basket Range, Australia

[73] Assignee: BHC Consulting Pty Ltd., Parkside, Australia

[21] Appl. No.: 09/054,070

[22] Filed: Apr. 6, 1998

[30] Foreign Application Priority Data

Apr. 7, 1997 [AU] Australia ................................. P06657

[51] Int. Cl.[7] .................................................. H03F 3/45
[52] U.S. Cl. ........................................... 330/260; 330/294
[58] Field of Search ............................... 330/260, 294, 330/107, 109, 297

[56] References Cited

U.S. PATENT DOCUMENTS 4,179,665  12/1979  Gregorian .............................. 330/107
5,371,479  12/1994  Hagerty .................................. 330/294

OTHER PUBLICATIONS

Distortion in power amplifiers #1, Electronics World & Wireless World, Aug. 1993, pp. 630–634.
Distortion in power amplifiers #2, Electronics World & Wireless World, Sep. 1993, pp. 730–736.
Distortion in power amplifiers #3, Electronics World & Wireless World, Oct. 1993, pp. 818–823.
Distortion in power amplifiers #4, Electronics World & Wireless World, Nov. 1993, pp. 926–934.
Distortion in power amplifiers #5, Electronics World & Wireless World, Dec. 1993, pp. 1009–1014.
Distortion in power amplifiers #6, Electronics World & Wireless World, Jan. 1994, pp. 41–45.

*Primary Examiner*—Benny Lee
*Assistant Examiner*—Henry Choe
*Attorney, Agent, or Firm*—Finnegan, Henderson, Farabow, Garrett & Dunner, L.L.P.

[57] ABSTRACT

An amplifier having error correction and including an output stage containing output transistors being connected to the amplifier output, and an output error correction stage containing a first high open loop gain amplifier which includes one or more transistors being the first high open loop gain amplifier transistor or transistors, an output of which is connected to an input of the output stage, the amplifier including at least two local negative feedback paths, a first local negative feedback path being between an output of the output stage and an input of the first high open loop gain amplifier and a second local negative feedback path being between an output of the first high open loop gain amplifier and an input of the first high open loop gain amplifier.

14 Claims, 5 Drawing Sheets

WIDEBAND OPERATIONAL AMPLIFIER HAVING A PLURALITY OF FEEDBACK LOOPS

This invention relates to amplifiers and in particular relates to an arrangement for error correction in an amplifier that can have improved accuracy.

While a main application of the invention is to audio frequency amplifiers the invention in its broadest sense is not limited to such an application.

BACKGROUND ART

It is a well known challenge to those seeking very high fidelity in reproduction to have an amplifier that will very accurately amplify which is to say therefore without significant distortion.

There have been numerous attempts to improve the accuracy of amplifiers and this invention is directed to a further technique which provides a significant improvement over amplfiers currently available to the market or any proposed by current best design of amplifier practise.

A current example of most relevant is a series of articles by D. Self in a is magazine entitled Electronic World+Wireless World from August 1993 to January 1994.

The problem to which this invention is directed then is to propose an electronic circuit and modifications to existing electronic circuits which will enable amplifiers to be manufactured which will enable higher accuracy to be achieved and in some cases an accuracy higher than that currently achieved by available amplifiers.

SUMMARY OF THE INVENTION

According to this invention there is provided an amplifier having an input, and an output, and including an output stage containing output transistors being connected to the amplifier output, and an output error correction stage containing a first high open loop gain amplifier which includes one or more transistors being the first high open loop gain amplifier transistor or transistors, an output of which is connected to an input of the output stage, wherein there are at least two local negative feedback paths, a first local negative feedback path being between an output of the output stage and an input of the first high open loop gain amplifier and a second local negative feedback path being between an output of the first high open loop gain amplifier and an input of the first high open loop gain amplifier, and the second local negative feedback path includes at least one capacitor, being a said first capacitor, wherein the said second path forms at least one local dominant pole, being a said first local dominant pole, and the amplifier having its input connected to an amplifier input stage, an output of the amplifier input stage being connected to an input of the first high open loop gain amplifier, and at least one or more of the first high open loop gain amplifier transistors being active amplifying components in the first high open loop gain amplifier having a power supply means coupled to either an or the output of the output stage amplifier so that a voltage of the power supply supplying the active amplifying components will follow substantially an output voltage of the output stage.

In this specification the following descriptions are used:

An input signal to the amplifier is termed an "amplifier input signal" and is supplied to an "amplifier input." The amplifier amplifies the amplifier input signal to provide an "amplifier output signal" at the "amplifier output."

Most "voltage feedback operational amplifiers" consist of three stages:

1. A "front end stage," to which the amplifier input is connected, is normally a differential voltage-to-current converter stage, in which current and voltage variations are relatively small;
2. A "voltage amplification stage," which follows the front end stage the output of which may produce large relative voltage variations about which an amplifier's dominant pole is often formed;
3. An "output stage" which follows the voltage amplification stage containing "output transistors" most often in the form of a voltage follower to which the amplifier output is connected.

The combination of the front end stage followed by the voltage amplification stage is referred to as "the input stage."

All three stages produce inaccuracies or distortion in the process of amplification. The highest level of distortion is most often produced in the output transistors of B-class power amplifiers. In high quality audio amplifiers, the distortion from these B-class output stages is considered by many audiophiles to be offensive to listening pleasure.

A current example of relevant art is in a series of articles by D. Self in a magazine entitled Electronic World+Wireless World from August 1993 to January 1994.

These disclose a first stage as a differential voltage to current converter, followed by voltage amplification stage about which a dominant pole is formed. This voltage amplification stage consists of a cascode amplifier feeding a constant current source so that distortion from the well known "Early effect" is avoided. Lowest distortion is achieved by using symmetrical complementary bi-polar transistors in the output stage, where the one half is a driver-npn-cum-power pnp pair configured with a fairly high measure of local negative feedback, an arrangement called a complementary feedback pair, and the other half is similarly a driver-pnp-cum-power pnp complementary feedback pair. The Self articles also disclose circuit layouts so that spurious sources of distortion causing mechanisms may be avoided.

The lowest combination of distortion as taught by those articles gives a total harmonic distortion of about 10 parts per million (10 ppm) at 1 kHz and a little over 100 ppm at 20 kHz. However this was measured in an amplifier of very modest power, namely 10 watts and it is intrinsically easier to obtain low distortions at low powers than at high powers, especially because most high power amplifiers use power MOSFETs as output transistors for practical reasons and these produce intrinsically more distortion than the symmetrical complementary feedback pair of bi-polar transistors recommended by Self. These figures are thought to be consistent with the best state-of-the-art low distortion amplifiers presently commercially available.

In general, the lower the open loop distortion, and the more overall negative feedback, the lower the distortion of the complete amplifier. This philosophy is substantially manifest in Self's articles. In general if an amplifier has an open loop gain of "−Y" (Y>0) at frequency "F" and produces an open loop distortion of "D" at frequency F, where Y is substantially greater than 1 this distortion may be reduced by adding negative feedback by a factor of about "Z" times if the closed loop gain is Z times smaller than Y at frequency F, and the closed loop negative feedback loop includes the distortion producing elements. Here the reduction in distortion in practice is typically within a factor of 3 of the value of Z.

Thus there is advantage in endeavouring to increase Y so that more negative feedback Z may be applied to reduce distortion. However, it is also well recognised that Y and thus Z have a practical limit imposed by stability requirements of the amplifier.

If for any desired overall amplifier closed loop gain "−G" (G>0) at frequency F, where Z=Y/G, and if the total open loop phase shift "P" exceed 90 degrees, and further if $$-Y \times \cos(P) > G \qquad \text{(i)}$$

the closed loop amplifier will not be stable assuming the feedback elements do not intrinsically effect P and Y owing to loading effects; it will self oscillate owing to an overall positive feedback factor exceeding 1.

Thus in order to maintain P in general close To 90 degrees and only allowing P to exceed 90 degrees at high frequencies where Y is of the order of lower than G, it is well recognised that the most effective solution is to design an operational amplifier with one dominant pole.

The effect of this dominant pole is that the amplifier has an open loop forward gain transfer function which decreases by a factor of two for every doubling of the frequency of the input signal within the useable frequency range of the amplifier; this is the often cited 6 dB-per-octave or 20 dB-per-decade roll-off. Also the open loop forward transfer function has a lag phase shift of about 90 degrees over most of the frequency range. In other words, the open loop operational amplifier for the most part behaves like an integrating differential input amplifier with substantial forward voltage gain at low frequencies. This open loop gain behaviour can be seen in many data sheets of "voltage feedback" high gain operational amplifiers. Indeed, the Self circuits as well as circuits for the lowest distortion audio power amplifiers are mostly designed with one dominant pole. This dominant pole is usually implemented by the use of at least one capacitor either configured as local negative feedback, most often about the voltage amplification stage, or a shunt to ground from the output of the voltage amplification stage.

In general these low distortion power amplifiers employ circuit topologies with substantial local feedback, but never the less not so much local negative feedback that a local dominant pole network containing a least one capacitor need be implemented to maintain stability, except for the amplifier dominant pole required for overall amplifier negative feedback stability.

Here the term "amplifier dominant pole" is a pole required to maintain stability of the amplifier only when overall global negative feedback is applied about the whole amplifier. The term "local dominant pole" is a pole required intrinsically to maintain stability of local circuitry owing to local negative feedback, regardless as to whether overall amplifier negative feedback is applied or not.

For a better understanding of this invention it will now be described with reference to a preferred embodiment which is described hereinafter with reference to drawings as follows

BRIEF DESCRIPTION OF THE DRAWINGS

With reference to FIG. 1, an input signal is applied between ground 140 and an amplifier input terminal 100 which is fed to the base of a transistor 101. Transistors 101 and 106, resistors 102 and 104, and constant current source 103 form a differential long tailed pair. "Degenerative" resistors 102 and 104 act to reduce the distortion generated by the non-linear base-emitter junctions and these produce local negative feedback with attendant gain reduction. Current source 103 is supplied by power supply rail 105. The collectors of 101 and 106 are led to a current mirror pair consisting of transistors 110 and 111 and resistors 112 and 114. This is supplied by power supply rail 113. The input to the voltage amplification stage is fed from the collectors of 101 and 110. This voltage amplification stage consists of cascode configured transistors 115 and 116 about which the dominant amplifier pole is formed by means of capacitor 119. The base of the common base transistor 116 is fed from a reference diode 117 whose bias current is supplied via resistor 118 which is connected to ground 140. Diode 117 is referenced to rail 113. The collector of 116 feeds a series voltage regulator 141 whose voltage may depend on the temperature of the output transistors. The current for 141 is supplied by a high quality constant current source consisting of transistor 120 and 122 and resistors 121 and 123. This source is supplied by rail 105 and ground. The output stage consists of transistors 124, 125, 129 and 130 and resistors 126, 131, 127 and 128. This stage consists of two symmetric complementary feedback pairs. Its input is fed from the output of the voltage amplification stage, namely from the voltage across 141. Overall amplifier negative feedback is fed from the amplifier output 109 to the inverting input at the base of 106 through voltage divider resistors 108 and 107, the latter being connected to ground 140.

This circuit topology is typical of the so called "operational power amplifiers" basically recommended by Self and this type of architecture is commonly found in state-of-the-art commercially available low distortion power amplifiers.

This type of operational amplifier circuit has taken many decades to develop and has stood the test of time despite numerous alternative circuit concepts and variations on the basic theme.

The dominant pole of this amplifier is formed by connecting capacitor 119 in a local negative feedback configuration about the input and output of the voltage amplification stage. This capacitance has to be large enough to ensure the gain at high frequencies is low enough to satisfy the requirement that $$Y \times \cos(P) < G. \qquad \text{(ii)}$$

with various possible amplifier output loads.

For such an arrangement, the open loop gain decreases by 20 dB per decade from a low frequency when the dominant pole becomes significant up to a high frequency when the other amplifier poles start to become significant. This dominant pole behaves approximately like an current to voltage integrator, that is, for an input signal current I to the voltage amplification stage, the output signal voltage V from the voltage amplification stage is approximately $$V = -1/C \times \int I \, dt \qquad \text{(iii)},$$

For a sinusoidal input signal I=Io sin(wt)

$$V = -Io/(wC) \times \cos(wt) \quad (iv).$$

Thus the complex forward gain of this voltage amplification stage about which the amplifier dominant pole is formed is approximately $$Z21 = V/I = 0 - j/(wC) = -j/(2pFC) \quad (v).$$

Thus at any intermediate frequency F, G is limited by equation (ii) and the 6 dB per octave frequency-gain relationship. Thus at a frequency F, the reduction in distortion due to negative feedback is constrained because the gain is constrained.

Figure 2:
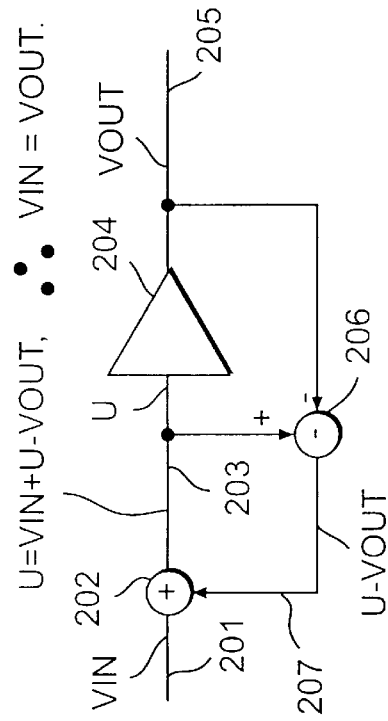
FIG. 2 shows a block diagram of an output stage error corrected amplifier with both positive and negative feedback paths.

However, there is another approach which has proved to be a substantial improvement on the traditional operational amplifier: M. J. Hawksford in Journal of the Audio Engineering Society, vol 29, no 1/2, January/February 1981 described a distortion correction technique in the output stages of audio amplifiers. The basic block diagram is shown in FIG. 2. This topology is particularly useful in power output stages which in general generate the most distortion. Here an input signal is applied to an input 201 of an output error correction stage. This is the input of an adding means 202. The sum output from 202 at 203 feeds the input of the output stage 204 containing output transistors. Here the output stage is non-inverting, and in most cases this is configured as a voltage follower. The difference between the output 205 of the output stage 204 and the input 203 of 204 is measured by a subtracting means 206. The difference signal output at 207 of this subtracter is fed back to the adder 202. The difference signal at 207 is by definition the distortion of the output stage, assuming an intended voltage forward transfer gain is unity. Suppose the input voltage at 201 is Vin, the output voltage at 205 is Vout and the sum voltage at 203, which is fed to the input of the output stage is u, then the difference at the subtracter output 207 is $$u - \text{Vout} \quad (vi)$$

and the sum at 203 is $$\text{Vin} + (u - \text{Vout}) \quad (vii)$$

The sum expression (vii) by definition is equal to u. Thus Vin=Vout, and hence the distortion is eliminated.

Iwamatsu appears to disclose, in U.S. Pat. No. 4,476,442 of October 1984, circuits based on the theory and circuits disclosed by Hawksford.

Figure 3:
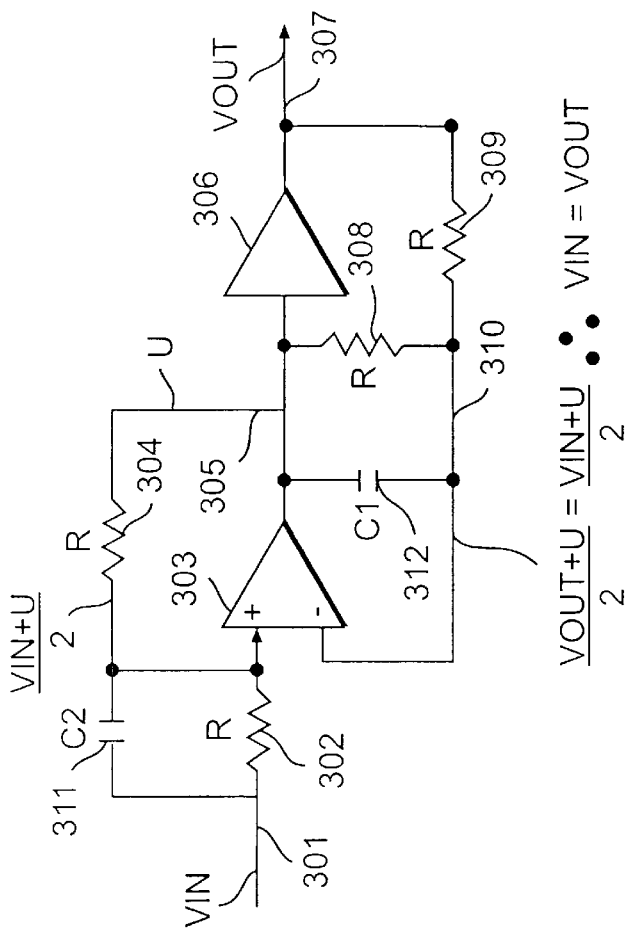
FIG. 3 shows a simplified equivalent of the architecture of FIG. 2 using an operational amplifier.

An effective equivalent operational circuit to FIG. 2 is shown in FIG. 3, the only difference being trivial multiplication factors such as a factor of two as shown. This includes an operational amplifier 303 with differential inputs. The input 301 of the output error correction stage is fed to resistor 302 which is connected to the non-inverting input of 303. This non-inverting input is also fed via resistor 304 from the output of 303, namely 305. The output 305 feeds the input of the output stage 306 containing output transistors and also the inverting input 310 of 303 via resistor 308. The output of 306 feeds the amplifier output 307 which also feeds back to the inverting input 310 of 303 via resistor 309.

If the resistors 302, 304, 308 and 309 have the same value, the input voltage is Vin, the output voltage is Vout, and the voltage at 305 is u, and the inputs of 303 are of high input impedance, then the voltage at the non-inverting input of 303 is $$(\text{Vin} + u)/2 \quad (vii)$$

and the voltage at 310 is $$(\text{Vout} + u)/2 \quad (viii)$$

Assuming the open loop gain of 303 is high, then $$(\text{Vin} + u)/2 = (\text{Vout} + u)/2$$

Thus Vin=Vout and thus there is no distortion.

In both the cases of FIG. 2 and 3 topologies, the voltage u is the sum of the input voltage plus that voltage required at the input of the output transistors as compensation to eliminate distortion at the output, thus rendering the output voltage equal to the input voltage.

The operations of the circuits in FIG. 2 and 3 consist of both a negative and a positive feedback loop. For example, the feedback from the output of 303 at 305 to the non-inverting input of 303 is positive feedback and that back to the inverting input of 303 is negative feedback.

Hawksford points out that the higher speed of transistors used in the adder and subtracter circuitry compared to typical power output transistors is one of the principal reasons for distortion reduction, assuming substantial overall negative feedback about the whole amplifier. In other words it is important that the forward voltage gain G12 poles of the adding or subtracting means (or operational amplifier) are of higher frequency than those intrinsic to the output transistors. In FIG. 2, the adder and subtracter circuit may consist of just a few transistors with gain up to several hundred MHz and associated passive components, which is much higher than that of most power output transistors.

Assuming the source impedance drive to the circuits shown in FIGS. 2 and 3 is low at high frequencies, and assuming in a certain frequency range the open loop gain of the error correction electronics is substantially greater than 1 and assuming that the phase shift in the output transistors exceeds 90 degrees owing to the poles in the output transistors, then a closed loop positive feedback contribution will exceed unity. Thus this circuit topology will necessarily be unstable at high frequencies unless steps are taken to reduce either the high frequency gain of the positive feedback loop, for example by the use of capacitor 311 in FIG. 3, or to increase the "direct" negative feedback across the operational amplifier at high frequencies, for example by the use of capacitor 312 in FIG. 3, or both.

It is thought that this requirement appears not to be disclosed by Hawksford or Iwamatsu.

However, the requirement for this pole has been disclosed by Candy in PCT/AU95/00424 of Jul. 13, 1995. Candy discloses capacitors for reducing the positive feedback at high frequencies, that is similar to the effect of C2 in FIG. 3, and also attenuation of the high frequency open loop gain by attenuation of the forward path to ground via capacitors. Candy further discloses the advantage of using small signal transistors in the output stage distortion correction circuitry, namely the adder, subtracter and buffer circuits whose power is supplied by floating supply rails bootstrapped to the output signal wherein these floating supply rails closely track the output signal.

For this error correction stage to perform optimally, it is necessary that the transfer functions of the adder and subtracter must in total be unity or else there remains a proportion of the stage distortion un-corrected. In practice this requires a preset potentiometer to be set and care needs be taken to ensure this transfer function does not change with temperature or time.

We have discovered a new circuit which is more effective than this error corrected stage, but without the requirement for precisely setting the transfer function.

Figure 4:
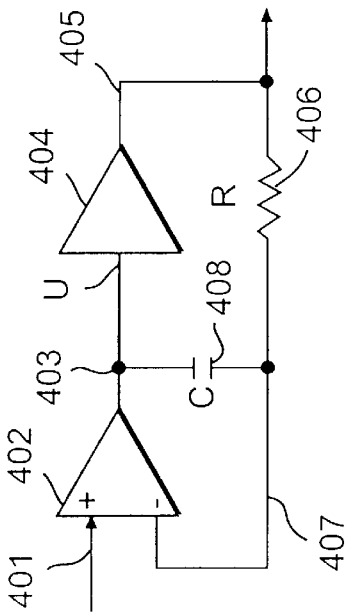
FIG. 4 shows a block diagrammatic embodiment of the output stage of this invention using only negative feedback paths.

A first embodiment of this invention is shown in FIG. 4. This shows an amplifier output error correction stage plus output stage containing output transistors, wherein an input signal is applied to the input 401 of the error correction stage which is a non-inverting input of a differential amplifier 402. The output 403 of 402 feeds the input of the output stage 404 containing output transistors. The output 405 of 404 feeds the amplifier output. 405 feeds back via resistor 406 to the inverting input 407 of 402. For the same reasons of stability given above regarding FIG. 2 and 3, it is necessary to increase the "direct" high frequency negative feedback, for example by the use of capacitor 408 which is connected between the output and inverting input of 402.

Figure 1:
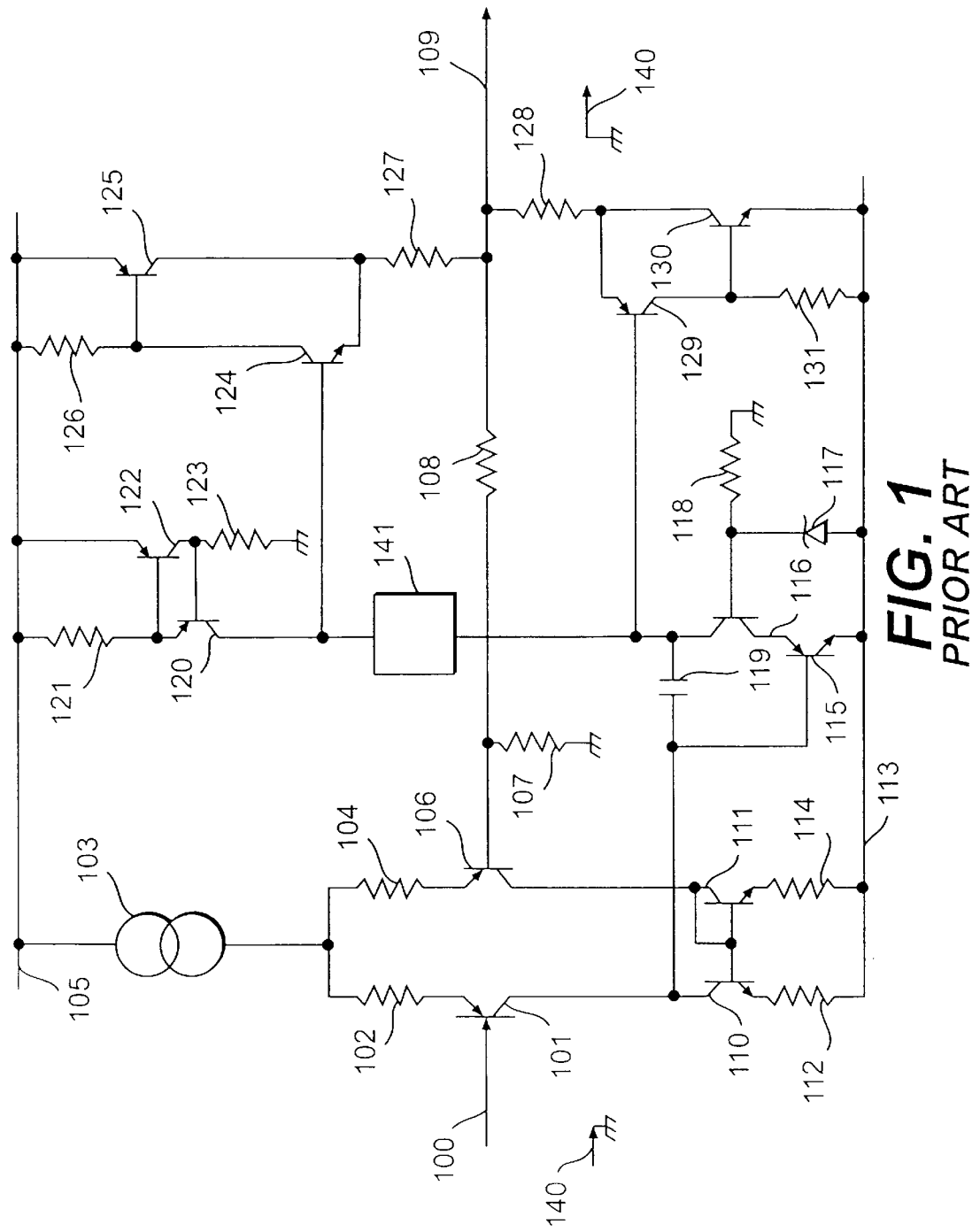
FIG. 1 shows an example of a well designed prior art "operational amplifier" type of power amplifier.

With this configuration used to correct distortion in the output stage, there is substantial local negative feedback, but this circuit differs from other traditional circuits, such as the circuit shown in FIG. 1 wherein there is substantially enough local negative feedback in the output stage owing to sufficiently high open loop gain of 402 to require a local dominant pole to be formed with the use of at least one capacitor to maintain stability, in this case 408.

From here on, the circuitry associated with the output transistors and output transistor buffer stages shall be called the output stage, and the circuitry associated with the electronics employed to correct the distortion generated in the output stage which contains the said local dominant poles, shall be called the output error correction stage. With reference to FIGS. 2, 3 and 4, the output stages consist of 204, 306 and 404, whilst the error correction stages consist of 202, 206, 302, 303, 304, 308, 309, 311, 312, 402, 406 and 408.

There are substantial advantages of the circuit topology of FIG. 4 over FIGS. 3 and 2 such as no requirement for precisely set resistors and increased negative feedback at lower frequencies assuming high D.C. open loop gain in the amplifier 402. New wideband commercially available integrated circuit operational amplifiers (sometimes called "video operational amplifiers.") assist in the effectiveness of the embodiment.

As the phase shift of typical power MOSFET output transistors exceeds 90 degrees at frequencies of the order of 10 MHz when the necessary gate resistors are used for high frequency stability, and some modern wide band operational amplifiers have unit gain stability and unity gain bandwidths of several hundred MHz with high D.C. open loop gains, the effect on the forward gain and phase shift of the whole output stage shown in FIG. 4 is not overtly changed from that of just the output stage consisting of transistors plus attendant buffer transistors circuitry alone. Thus the whole amplifier's dominant pole, required to ensure stability when overall global feedback is applied, is relatively unaffected by the addition to the amplifier of the output error correction stage. Thus a distortion reduction of several hundred times is possible even at 20 kHz compared to the traditional amplifier which does not include this extra substantial local negative feedback about the output stage.

Because the power rails of audio amplifiers are usually of the order of 50 volts, and the wideband operational amplifiers which contain transistors which act as active amplifying components often operate at a maximum of a +5 and, −5 volt rail, it is necessary to provide floating power supply rails to the operational amplifier which track the output signal, and furthermore, in order to avoid distortion arising from signals entering the operational amplifier through its supply rails, these rails should closely track the output signal. (Where reference is made to transistors it is intended that the reference shall be interpreted to include devices that also might act in a similar way to current transistor and accordingly the word transistor is to be understood in a broadest generic way. This may be achieved by coupling capacitive bootstrapping to the amplifier output, for example, furthermore, there is substantial advantage in also supplying power to constant current sources which load the output of the voltage amplification stage and also to output buffer transistors from these said floating power supply rails, and further, employing small signal transistors with high gain, low capacitance and high transition frequencies in the circuitry of these said constant current sources and buffers because of the advantages of linearity and high speed.

The basic topology of FIG. 4 is advantageous even if integrated circuit operational amplifiers are not used; instead, one or more transistors, plus passive components may be configured to produce the same basic configuration as that shown in FIG. 4.

Figure 5:
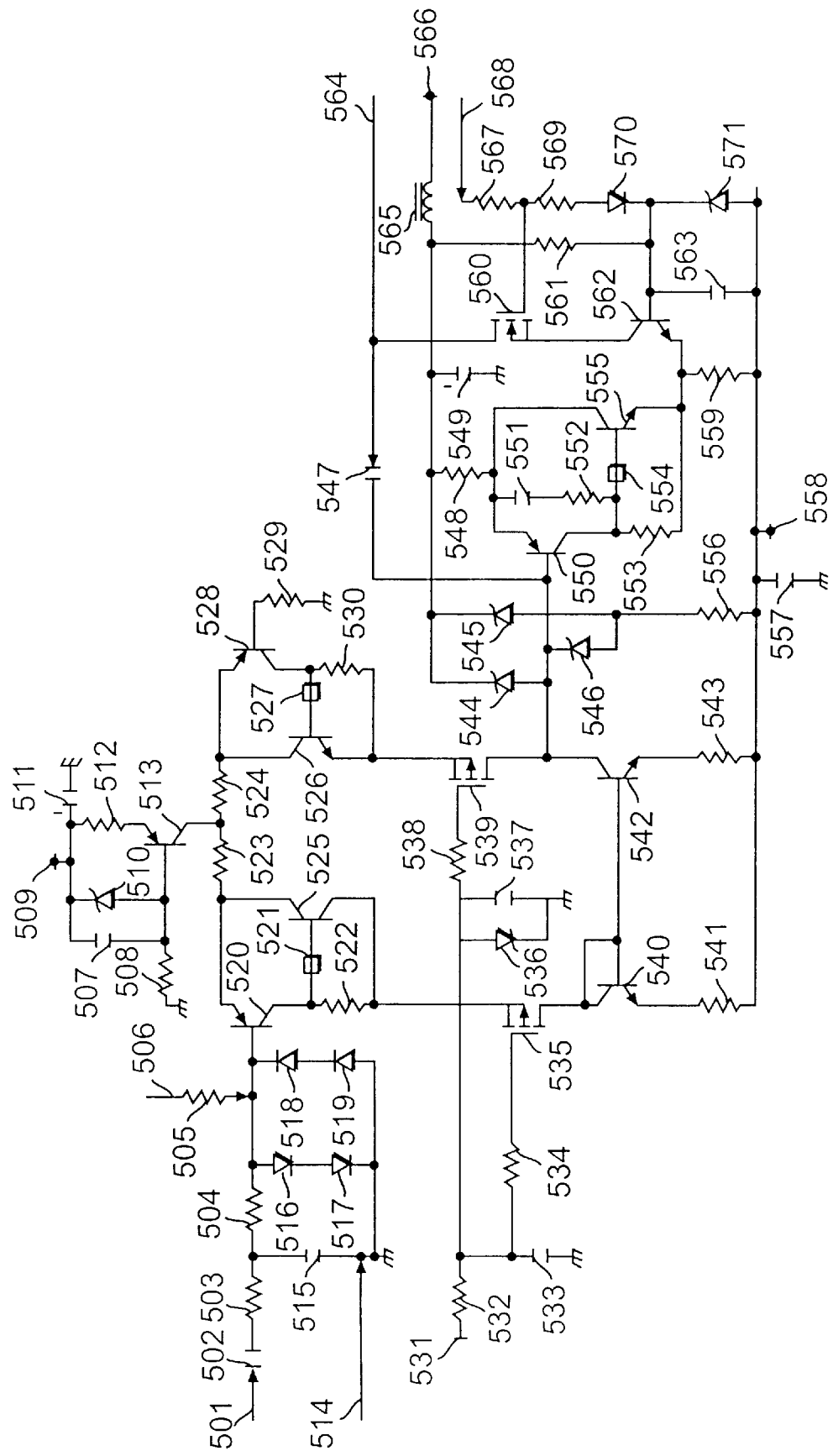
FIGS. 5, 6 and 7 show one embodiment of this invention including two local dominant poles in the output stage, one local dominant pole within the voltage amplification stage, and one amplifier dominant pole formed about the voltage amplification stage.
Figure 6:
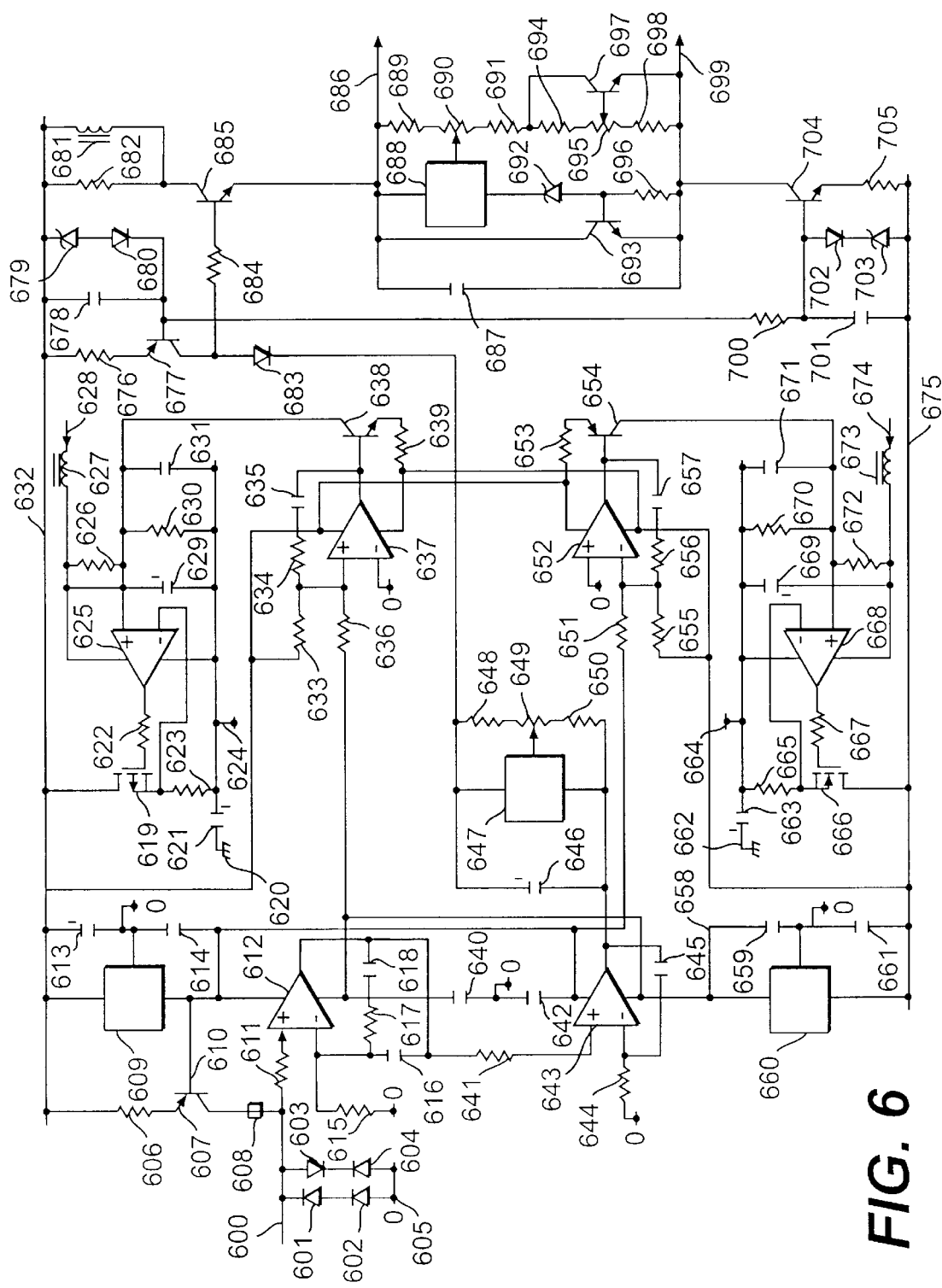
Figure 7:
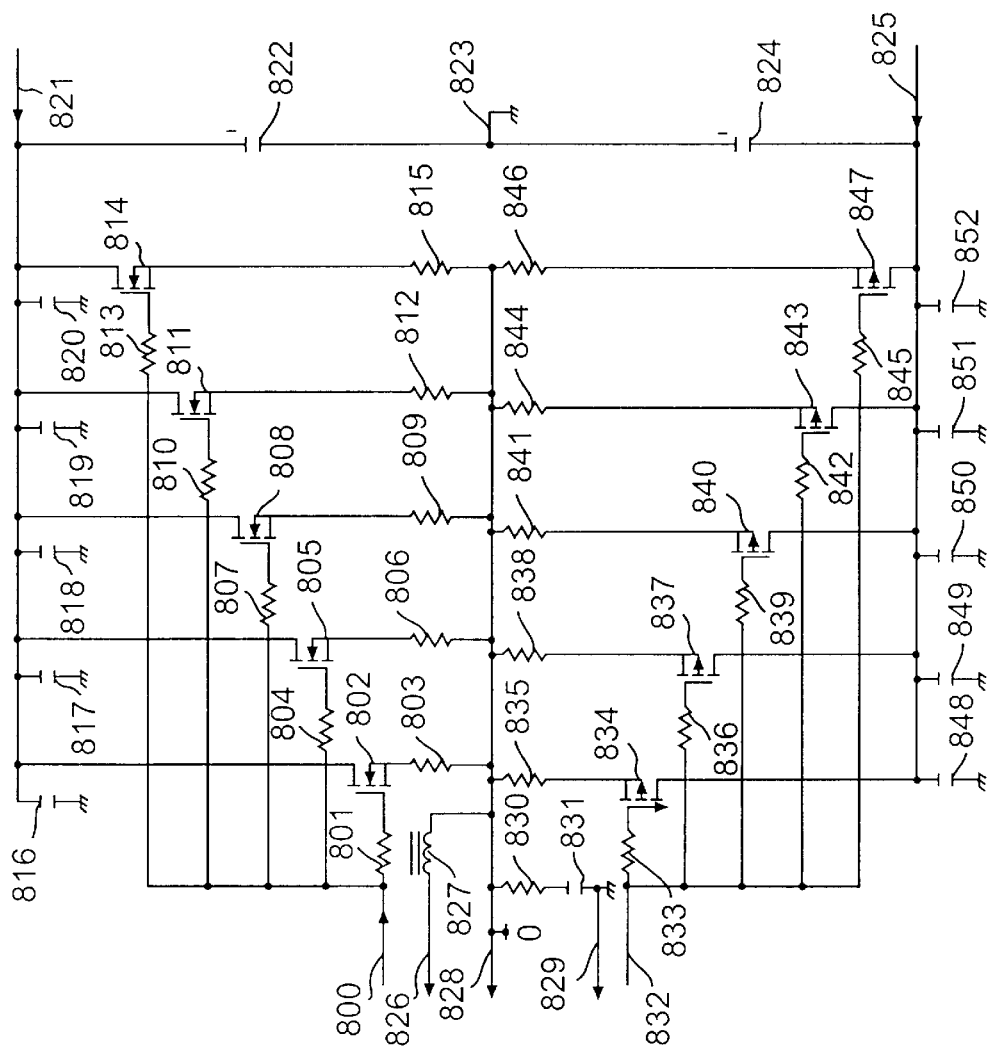

Because the forward transfer function of this new arrangement is approximately unchanged in terms of poles and stability as far as the overall amplifier is concerned, further distortion reduction can be achieved by adding a further wideband operational amplifier, whose power is also supplied by the floating power supply rails, to the output error correction stage. This wideband operational amplifier also requires its own local dominant pole setting components in the output error correction stage. The amplifier driving the output stage will here on be referred to as the first high open loop gain amplifier and its local dominant pole be referred to as the first local dominant pole, while the amplifier driving the first high open loop gain amplifier be referred to as the second high open loop gain amplifier and its local dominant pole be referred to as the second local dominant pole. The amplifier's dominant pole is the pole formed about the voltage amplification stage. In general, the lowest distortion is achievable with the first local dominant pole set as high as possible, in terms of dBHz, for the wideband amplifier forward closed loop gain, in order to comfortably maintain stability in just the output stage plus first high open loop gain amplifier alone. Next the second local dominant pole is set in order to comfortable maintain stability in the output stage plus first and second high open loop gain amplifier taken in isolation. Lastly the amplifier's dominant pole is set as high as possible in order to comfortably maintain stability with the whole amplifier connected up. Because the output stage is essentially a voltage follower, and because the phase exceeds 90 degrees at several megahertz for both the cases of the circuit arrangements of the conventional voltage follower power MOSFET output stage and the new set-up including the output stage plus the output error correction stage which consists of the first and second high open loop gain amplifier with attendant first and second local dominant poles, the requirements on the amplifier's dominant pole is similar for both cases. FIGS. 5, 6 and 7 shows a preferred embodiment of this invention. The input voltage to current converter and most of the voltage amplification stage is shown in FIG. 5. FIG. 6 shows the output error correction circuitry plus floating power supplies and output buffer stage circuitry. FIG. 7 shows circuitry of the output transistors. The amplifier input is fed between the active input 501 and ground 514. 501 feeds a D.C. decoupling capacitor 502, which then feeds resistor 503 which is connected to resistor 504 and capacitor 515. 515 is also connected to ground 514 which is employed to attenuate high frequency input signals and to set the high frequency negative feedback factor of the amplifier. Resistor 504 connects to the inverting input of the amplifier. This is the base of transistor 520. Two back to back pairs of series diodes 516, 517, 518 and 519 are connected from this inverting input to ground for protection purposes in the event of overload. 520 is a PNP transistor which is connected to NPN transistor 526 in a tight local negative feedback loop. Resistor 522 sets the quiescent current through 520; the major current variations occurring in 525. This arrangement is known as a complementary feedback pair, that is, a network consisting of a first transistor whose base is the input of the network and whose collector is connected the base of a second transistor. A resistor is connected between the base and emitter of the second transistor. The collector of the second transistor is connected the emitter of the first transistor. The transistors are of complementary doping, that is one is npn, the other pnp.

Transistor 513, resistors 512 and 508, shunt reference diode 510 and decoupling capacitor 507 form a constant current source powered from ground and supply rail 509 which is AC coupled to ground by capacitor 511. This current source feeds two degenerative long tailed pair resistors 523 and 524. Transistors 528 and 526 and resistor 530 form a similar complementary feedback pair to transistors 520 and 525 and resistor 522. The base of 528 is the non-inverting input of the amplifier. This is connected to resistor 529 which is connected to ground. 529 is used for bias and stability purposes. Transistors 520 and 528 are low noise types so that the noise level of the amplifier is low. It is best if 525 and 526 are micro-wave transistors with an Ft of several GHz so that the poles of this stage play effectively no role in the setting the requirements of the dominant amplifier pole and thus allow more overall negative feedback as well as excellent linearity of this differential input voltage to current converter even up to very high frequencies. The bases of 525 and 526 have series ferrite beads 521 and 527 for stability purposes. This input differential voltage to current converter feeds cascode MOSFETs 535 and 539. The gates of these are biased at several volts below ground through the voltage drop across shunt reference diode 536. This is biased through current flowing through resistor 532 from power supply rail 531. Capacitors 533 and 537 is used for high frequency ground coupling. Gate resistors connecting the gates of 536 and 539 to 536, 534 and 538 are used to maintain stability. The drains of 535 and 539 feed a current mirror consisting of transistors 540 and 542 and resistors 541 and 543 which is supplied by power supply rail 558. 558 is AC coupled to ground via capacitor 557. The drain of 539 and collector 542 feeds the input of the voltage amplification stage.

As discussed above, this voltage amplification stage is essentially an integrating current to voltage converter. The ideal open loop characteristics for such a converter are "infinite" dynamic input impedance, linear "infinite" forward gain and "infinite" output load impedance. Here "infinite" in reality means the higher the better. In conventional state-of-the-art voltage amplification stages such as that in FIG. 1, the open loop input impedance is not substantially high; it is the input impedance of a common emitter stage, the open loop forward gain is also not substantially high, nor linear; it is essentially the forward current gain of the common emitter transistor and the linearity of this transistor.

At high frequencies (above several kHz), the current gain of common emitter transistor is lower owing to the effects of transition frequency assuming this is a few hundred MHz and non-linear transistor capacitances significantly add to the non-linearity of this stage. Assuming a high performance from the rest of the amplifier, then if a conventional voltage amplification stage is used such as that shown in FIG. 1, this conventional stage will be the dominant source of amplifier distortion; mostly second harmonic distortion. Thus lower overall amplifier distortion is possible if this stage is improved beyond that attainable by the current state-of-the-art voltage amplification stages. A novel improved stage is shown in FIG. 5. This new arrangement achieves lower distortion by means all of the above desirable ideal open loop voltage amplification stage characteristics. The input to this stage is at the base of transistor 550. Transistors 550 and 555 and resistor 553 form a complementary feedback pair. The emitter of 550 and collector of 555 are connected via resistor 548 to power supply rail 566 which is AC decoupled via inductor 565 and AC coupled to ground by capacitor 549. The open loop input impedance of this arrangement, that is without the amplifier dominant pole capacitor connected, is much higher than the common emitter transistor shown in FIG. 1 and the forward gain is high assuming a relatively low value of resistor 548. The output of this arrangement feeds a double cascode arrangement consisting of transistors 562 and 560. The current is supplied from rail 558 via rosistor 559. The base of 562 is held at a constant voltage by the voltage drop across shunt reference diode 571. This is AC coupled to 558 by means of capacitor 563. As the voltage across 559 is nearly constant, the current through it is nearly constant. The amplifier output is fed to 568. This is fed via a voltage divider consisting of resistors 567 and 569 and diode 570 to the base of 562 and diode 571. The divided output voltage at the resistor 567 and 569 node is fed to the gate of 560. This arrangement has the effect of partial cancellation of some distortion characteristics arising from these transistors. The output of this stage, 564, is connected to the amplifier's dominant pole capacitor 547 which is fed back to the input of this voltage amplification stage. To improve the speed and high frequency linearity of this stage, it is advantageous for transistor 555 to be a wideband microwave device with an Ft of several GHz. A ferrite bead 554 on the base (or series base resistor) is necessary for stability as well as resistor 552 and capacitor 551. Resistor 552 and capacitor 551 form a local dominant pole to maintain stability intrinsically of the closed loop voltage amplification stage. The are other such arrangements for the voltage amplification stage with high open loop input impedance, using wideband devices, such as a wideband operational amplifier, which also require a local dominant pole for intrinsic stability of closed amplifier dominant pole negative feedback loops, which may produce substantially lower distortion than the conventional voltage amplification stage. Diodes 544, 545, 546 and resistor 556 are used for overload protection purposes.

The output of this stage, 564 which connects to the input of the output error correction stage 600, is fed to a constant current source consisting of transistor 607 and resistor 606 which is supplied with power from floating power supply rail 632; the voltage between the base of 607 and 632 being held constant. A ferrite bead 608 on the collector of 607 is used for stability purposes. 600 is also connected to the non-inverting input of a wideband differential operational amplifier 612 which is referred to as the second high open loop gain amplifier. A series resistor 611 may be required for stability reasons. The amplifier output 605 throughout FIG.

6 is marked as an "O." This is fed back to the inverting input of 612 via resistor 615. The dominant local pole of 612, referred to as the second local dominant pole, is formed by resistor 615, capacitor 616 and capacitor 618 in series with damping resistor 617 connected between the output and inverting input of this wideband differential operational amplifier. There are several possible different networks of passive components which are satisfactory for the purposes of forming this local pole. Diodes 601, 602, 603 and 604 are used for overload protection purposes. The positive supply to 612 is supplied from the output of voltage regulator 609 which in turn is supplied by power from floating supply rail 632. The base of 607 is connected to the output of 609. Capacitor 613 tightly AC couples floating rail 632 to the amplifier output and capacitors 614 and 642 AC couple the output of 609 to the amplifier output 605. The negative supply to 612 is supplied from the output of voltage regulator 660 which in turn is supplied with power from floating supply rail 675. Capacitor 661 tightly AC couples floating rail 675 to the amplifier output and capacitors 659 and 640 AC couples the output of 660 to the amplifier output.

The output of 612 is fed to the non-inverting input of wideband differential operational amplifier 643. This is referred to as the first high open loop gain amplifier. Resistor 641 may be required for stability reasons. The amplifier output 605 is fed back to the inverting input of 643 via resistor 644. The dominant local pole of 643, referred to as the first local dominant pole is formed by resistor 644 and capacitor 645 which is connected between the output and inverting input of this Wideband differential operational amplifier. This pole however may also be similar to the network of 616, 617 and 618 or various other appropriate networks. This amplifier 643 is also supplied by power from regulators 609 and 660. The output of 643 is connected to a constant voltage regulator consisting of adjustable regulator 647 and adjustment setting resistors 648, 649 and 650. This is decoupled by capacitor 646. This voltage regulator is fed with current via diode 683 from a constant current source consisting of transistor 677, resistor 676 and the voltage across the base of 677 and rail 632 is held by the voltage drop across diode 680 and reference diode 679. This base voltage is AC coupled to floating rail 632 by means of capacitor 678. The diodes 679 and 880 are biased by current flowing through resistor 700. The node of diode 683 and the collector of 677 is fed to the input of a buffer stage which is the input of the output stage, namely the base of transistor 685 via resistor 684 which is required for stability. The collector of 658 is supplied by floating rail 632 via resistor 682 and inductor 681 which are required for stability reasons. One output of the buffer stage, namely 686, the emitter of transistor 685, is fed to the inputs of the output transistors, the N-channel devices, and also a shunt voltage regulator used to set the quiescent current in the output transistors. This regulator consists of regulator 688 whose control input is fed by voltage divider resistors 689, 690 and 691. Current is supplied to these resistors via a temperature compensating network consisting of transistor 697 and biasing resistors 694, 695 and 698. 697 is thermally coupled to the output transistors. The regulator 688 is connected via a zener diode 692 to the base of transistor 693 and resistor 696. 696 is connected to the other buffer output 699, as too are the emitters of 693 and 697 and resistor 698. Capacitor 687 AC couples 686 to 699. A constant current source consisting of transistor 704 and resistor 705 and diodes 702 and 703 set the quiescent current through the shunt voltage regulator connecting 686 and 699. The current supplying diodes 703 and 702 flows through resistor 700. This constant current source is power supplied by floating supply rail 675. Capacitor 701 AC couples the base of 704 to rail 675.

The current to floating rail 632 is supplied via transistor 619 and resistor 623 from power supply rail 624. Capacitor 621 AC couples this rail to ground 620 and 662. The gate of transistor 619 is connected to the output of amplifier 625 via resistor 622 which is required for stability purposes. The source of 619 is connected to the inverting input of 625. Thus 625 is connected as a servo loop to set the current flowing through 619. The value of this current is controlled by the voltage drop between the non-inverting input of 625 and rail 624, namely the voltage across capacitor 631 which is used to AC couple the non-inverting input to rail 624. 625 is power supplied by power supply rails 624 and 628. 628 is AC decoupled by inductor 627 and the supply across 625 is AC coupled to 624 by capacitor 629. The voltage across 631 is set by resistor divider 630 and 626, which are connected across 629, and the current flowing to these resistors from the collector of transistor 638. The base of 638 is connected to the output of amplifier 637. The non-inverting input of this amplifier is connected to the amplifier output 605. The inverting input is fed from a voltage divided by resistors 633 and 636 connected between floating supply rail 632 and the output of 660. Amplifier 637 performs the task of a servo loop to maintain the relative voltage between the amplifier output 605 and floating rail 632 The local pole for this is set by capacitor 635 and damping resistor 634. The current flowing through transistor 638 is set by the voltage between the base of 638 and rail 675 and the value of the resistor 639 which connects the emitter of 638 to floating rail 675.

The current to floating rail 675 is supplied via transistor 666 and resistor 665 from power supply rail 664. Capacitor 663 AC couples this rail to ground 662 and 620. The gate of transistor 666 is connected to the output of amplifier 668 via resistor 667 which is required for stability purposes. The source of 666 is connected to the inverting input of 668. Thus 668 is connected as a servo loop to set the current flowing through 666. The value of this current is controlled by the voltage drop between the non-inverting input of 668 and rail 664, namely the voltage across capacitor 671 which is used to AC couple the non-inverting input to rail 664. 668 is power supplied by power supply rails 664 and 674. 674 is AC decoupled by inductor 673 and the supply across 668 is AC coupled to 664 by capacitor 669. The voltage across 671 is set by resistor divider 672 and 670, which is connected across 669, and the current flowing to these resistors from the collector of transistor 654. The base of 654 is connected to the output of amplifier 652. The non-inverting input of this amplifier is connected to the amplifier output 605. The inverting input is fed from a voltage divided by resistors 655 and 651 connected between floating supply rail 675 and the output of 609. Amplifier 652 performs the task of a servo loop to maintain the relative voltage between the amplifier output 605 and floating rail 675. The local pole for this is set by capacitor 657 and damping resistor 656. The current flowing through transistor 654 is set by the voltage between the base of 654 and rail 632 and the value of the resistor 653 which connects the emitter of 654 to floating rail 632.

The "pull up" output power transistors are configured as five parallel N-channel source followers, transistors 802, 805, 808, 811 and 814. Each of these has a source resistor feeding the amplifier output 828, namely resistors 803, 806, 809, 812, 815. The gates of these transistors each have a gate resistor, namely 801, 804, 807, 810 and 813, which are required for stability purposes and these are fed from the buffer output 686. These source followers drains are supplied by power supply rail 821 which is AC coupled to ground by capacitors 816, 817, 818, 819, 820 and 822.

The "pull down" output power transistors are configured as five parallel P-channel source followers, transistors 834, 837, 840, 843, and 847. Each of these has a source resistor feeding the amplifier output 828, namely resistors 835, 838, 841, 844, and 846. The gates of these transistors each have a gate resistor, namely, 833, 836, 839, 842 and 845, which are required for stability purposes and these are fed from the buffer output 699. These source followers drains are supplied by power supply rail 825 which is AC coupled to ground by capacitors 848, 849, 850, 8511 852 and 824.

The final amplifier output 826 is high frequency decoupled via inductor 827, and the output 828, which is fed to 605, 568 and 506, is high frequency damped by resistor 830 which is connected to 828 and through series capacitor 831 to ground 829. 831, 830 and 827 are required for stability purposes. The amplifier overall negative feedback is fed from 828 and 506 through resistor 505 back to the amplifier inverting input at the base of transistor 520.

Substantial reduction in distortion may be obtained in the circuits shown in FIGS. 5, 6 and 7 with the use of operational amplifiers with even modest unit gain bandwidths, such as an NE5534. These however have intrinsic "internal" dominant poles which will affect the requirements on the amplifier's dominant pole compared to the conventional circuit arrangement. Significantly greater reduction can be obtained with the use of operational amplifiers of higher unit gain bandwidth, at least 100 MHz or even better still, at least 200 MHz. The D.C. open loop gain for excellent results should be at least 100, or even better still, at least 1000.

Using the invention described herein, we have built an amplifier with less than 1 ppm distortion at 20 kHz and an unmeasurable rating at 1 kHz, certainly less than 0.3 ppm and probably less than 0.1 ppm.

The claims defining the invention are as follows:

1. An amplifier comprising:
   an input coupled to an input stage;
   an output coupled to an output stage;
   an output error correction stage coupled to an output of said input stage;
   an output of the output error correction stage being coupled to an input of said output stage;
   said output error correction stage including a first high open loop gain amplifier including a transistor comprising an active amplifying component;
   a first negative feedback path coupled to an output of the output stage and an input of said first high open loop gain amplifier;
   a second negative feedback path coupled between the output and input of said first high open loop gain amplifier;
   said second negative feedback path including at least one capacitor;
   said second negative feedback path forming a first local dominant pole;
   an output of said input stage being coupled to an input of said high open loop gain amplifier; and
   a power supply having an input coupled to said output stage and an output coupled to said active amplifying component; whereby
      the power supply output voltage substantially follows the output voltage of said output stage.

2. An amplifier as in claim 1, wherein the transistor comprising the active amplifying component in the first high open loop gain amplifier is provided as a first wideband operational amplifier.

3. An amplifier as in claim 2, wherein the first wideband operational amplifier, comprises a differential operational amplifier with a unit gain bandwidth of greater than 100 MHz and a direct current open loop differential gain of more than 100.

4. An amplifier as in any of claims 1, 2 or 3, further including a first constant-current source arranged to constrain to a substantially constant current power applied to the output of said first input stage.

5. An amplifier as in claim 1, wherein the amplifier further includes a buffer electronics network within the output stage and means for connecting power to the buffer electronics network supplied by said floating power supply rails; the output of the first high open loop gain amplifier being connected to an input of the buffer electronics network, and an output of the buffer electronics network being connected to an input of the output transistor.

6. A low distortion electronic amplifier having an input for receiving a signal to be amplified, an output, and an output stage including an output transistor, an output of the output stage for providing the amplifier output, an output error correction stage including a first high open loop gain amplifier and an output connected to an input of the output stage, at least two negative feedback paths, a first negative feedback path including a forward transfer function of the output transistor coupled between an output of the output stage and an input of the first high open loop gain amplifier and a second negative feedback path coupled between an output of the first high open loop gain amplifier and an input of the first high open loop gain amplifier and including a first capacitor in series with the second negative feedback path, wherein the said second negative feedback path forms a first local dominant pole, the output error correction stage including a second high open loop gain amplifier having an output connected to an input of the first high open loop gain amplifier, a third local negative feedback path coupled between an output of the output stage and an input of the second high open loop gain amplifier and a fourth local negative feedback path coupled between an output of the second high open loop gain amplifier, an input of the second high open loop gain amplifier and the fourth negative feedback path including a second capacitor, wherein said fourth negative feedback path forms a second local dominant pole, and an input stage to which an input signal is applied, an output of the input stage being applied to an input of the second high open loop gain amplifier, and the first high open loop gain amplifier being supplied by floating power rails, wherein said floating power rails are adapted to substantially track the output signal.

7. An amplifier as in claim 6, wherein the said first high open loop gain amplifier includes a first wideband operational amplifier whose power is supplied by said floating power supply rails.

8. An amplifier as in claim 7, wherein the first wideband operational amplifier, comprises a differential operational amplifier with a unit gain bandwidth of greater than 100 MHz and a D.C. open loop differential gain of more than 100.

9. An amplifier apparatus as in claim 6, wherein said second high open loop gain amplifier includes a second wideband operational amplifier whose power is supplied by said floating power supply rails.

10. An amplifier apparatus as in claim 9, wherein the second wideband operational amplifier comprises a differential operational amplifier with a unit gain bandwidth of greater than 100 MHz and a D.C. open loop differential gain of more than 100.

11. An amplifier as in any one of claims 6 to 10, further including a first constant current source whose power is supplied by said floating power supply rails and whose constant current is supplied to the output of the amplifier input stage.

12. An amplifier as in claim 6, further including a buffer electronics network within the output stage, the power supplied to the buffer electronics network being supplied by said floating power supply rails, the output of the first high open loop gain amplifier being connected to at least one input of the buffer electronics network, and at least one output of the buffer electronics network being connected to an input of the output transistors.

13. An amplifier as in claim 6, further including a voltage to current converter stage disposed within said input stage to which the amplifier input signal is applied, an output of the voltage to current converter stage being connected to a voltage amplification stage about which the amplifier dominant pole is formed, said amplifier dominant pole forming a closed negative feedback loop about the voltage amplification stage, the voltage amplification stage including a wideband device having high amplifier dominant pole open loop input impedance, a fifth local negative feedback path being formed about the wideband device, the fifth local negative feedback loop providing a third local dominant pole and including a third capacitor, an output of the voltage amplification stage being connected to an input of the output error correction stage.

14. An amplifier as in claim 13, wherein the voltage amplification stage includes transistors configured in a complementary feedback pair with at least one transistor being a wideband device and a network including said third capacitor connected between the base and collector of the wideband transistor.

* * * * *